(12) United States Patent
Im et al.

(10) Patent No.: US 11,005,479 B2
(45) Date of Patent: May 11, 2021

(54) PHASE DETECTION CIRCUIT, AND CLOCK GENERATING CIRCUIT AND SEMICONDUCTOR APPARATUS USING THE PHASE DETECTION CIRCUIT

(71) Applicant: SK hynix Inc., Icheon-si (KR)

(72) Inventors: Da In Im, Icheon-si (KR); Young Suk Seo, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/677,255

(22) Filed: Nov. 7, 2019

(65) Prior Publication Data

US 2020/0336148 A1    Oct. 22, 2020

(30) Foreign Application Priority Data

Apr. 16, 2019    (KR) .................. 10-2019-0044170

(51) Int. Cl.
*H03L 7/081*    (2006.01)
*H03L 7/085*    (2006.01)

(52) U.S. Cl.
CPC .......... *H03L 7/0814* (2013.01); *H03L 7/085* (2013.01)

(58) Field of Classification Search
CPC ........ H03K 23/52; H03L 7/08; H03L 7/0818; H03L 7/085; H03L 7/0814
See application file for complete search history.

(56) References Cited

U.S. PATENT DOCUMENTS

| 7,777,543 | B2 | 8/2010 | Park | |
|---|---|---|---|---|
| 2002/0070783 | A1* | 6/2002 | Saeki | G06F 1/06 327/235 |
| 2003/0142773 | A1* | 7/2003 | Shirota | H03L 7/148 375/373 |
| 2004/0071227 | A1* | 4/2004 | Lee | H03L 7/0814 375/308 |
| 2006/0261869 | A1* | 11/2006 | Gomm | H03L 7/0812 327/158 |
| 2007/0069779 | A1* | 3/2007 | Kim | H03L 7/0805 327/158 |
| 2008/0130800 | A1* | 6/2008 | Maxim | H03C 3/40 375/345 |
| 2008/0164917 | A1* | 7/2008 | Floyd | H03L 7/1974 327/117 |
| 2008/0278203 | A1* | 11/2008 | Obkircher | H03L 7/0814 327/116 |
| 2009/0129446 | A1* | 5/2009 | Wilhite | H03F 1/34 375/147 |
| 2009/0243679 | A1* | 10/2009 | Smith | H03L 7/07 327/158 |

(Continued)

FOREIGN PATENT DOCUMENTS

KR    1020160076197 A    6/2016

*Primary Examiner* — Adam D Houston
(74) *Attorney, Agent, or Firm* — William Park & Associates Ltd.

(57) ABSTRACT

A phase detection circuit includes an edge trigger circuit and a duty detection circuit. The edge trigger circuit generates a reference pulse signal and a comparison pulse signal based on a target clock signal and at least two clock signals having phases adjacent to the phase of the target clock signal. The duty detection circuit generates a phase detection signal by detecting the duty ratio of the reference pulse signal and the comparison pulse signal.

22 Claims, 8 Drawing Sheets

(56) References Cited

U.S. PATENT DOCUMENTS

| | | | |
|---|---|---|---|
| 2009/0295441 A1* | 12/2009 | Kwak | H03L 7/0805 327/158 |
| 2009/0322388 A1* | 12/2009 | Fiedler | H03L 7/0812 327/155 |
| 2010/0085094 A1* | 4/2010 | Ma | H03L 7/0818 327/158 |
| 2010/0283520 A1* | 11/2010 | Ku | H03L 7/10 327/158 |
| 2011/0156757 A1* | 6/2011 | Hayashi | H03L 7/085 327/3 |
| 2011/0221495 A1* | 9/2011 | Lee | H03L 7/0814 327/158 |
| 2011/0286510 A1* | 11/2011 | Levantino | H03L 7/18 375/226 |
| 2011/0291720 A1* | 12/2011 | Ku | H03L 7/0818 327/158 |
| 2012/0062291 A1* | 3/2012 | Saitoh | H03L 7/087 327/157 |
| 2012/0242314 A1* | 9/2012 | Namekawa | H02M 3/157 323/283 |
| 2012/0259477 A1* | 10/2012 | Abido | H02J 3/38 700/297 |
| 2012/0319478 A1* | 12/2012 | Gentchev | H02M 1/14 307/28 |
| 2013/0002319 A1* | 1/2013 | Yeo | H03L 7/089 327/157 |
| 2013/0328602 A1* | 12/2013 | Kibune | H03K 5/1565 327/156 |
| 2013/0335126 A1* | 12/2013 | Chaivipas | H03K 5/06 327/175 |
| 2014/0002155 A1* | 1/2014 | Park | H03L 7/087 327/158 |
| 2014/0333346 A1* | 11/2014 | Bae | H03L 7/1072 327/5 |
| 2015/0002196 A1* | 1/2015 | Takahashi | H03L 7/1972 327/158 |
| 2015/0160012 A1* | 6/2015 | Ii | G01C 19/5614 73/504.12 |
| 2015/0229314 A1* | 8/2015 | Hata | H03K 3/012 327/218 |
| 2016/0156342 A1* | 6/2016 | Yun | H03K 7/08 327/158 |
| 2016/0182063 A1* | 6/2016 | Seo | H03L 7/16 327/149 |
| 2016/0249004 A1* | 8/2016 | Saeki | H03M 1/12 |
| 2016/0344378 A1* | 11/2016 | Saito | H03B 27/00 |
| 2017/0201259 A1* | 7/2017 | Lee | H03L 7/183 |
| 2017/0261617 A1* | 9/2017 | Veitsel | G01S 19/23 |
| 2018/0159546 A1* | 6/2018 | Ek | H03L 7/191 |
| 2019/0013797 A1* | 1/2019 | Thuries | H03F 3/24 |
| 2019/0013814 A1* | 1/2019 | Thuries | H03H 11/20 |
| 2019/0081619 A1* | 3/2019 | Kim | H03K 5/1565 |
| 2019/0238376 A1* | 8/2019 | Shih | H03L 7/099 |
| 2019/0288830 A1* | 9/2019 | Zhuang | H03L 7/0814 |
| 2020/0076298 A1* | 3/2020 | Jung | H02M 1/00 |

* cited by examiner

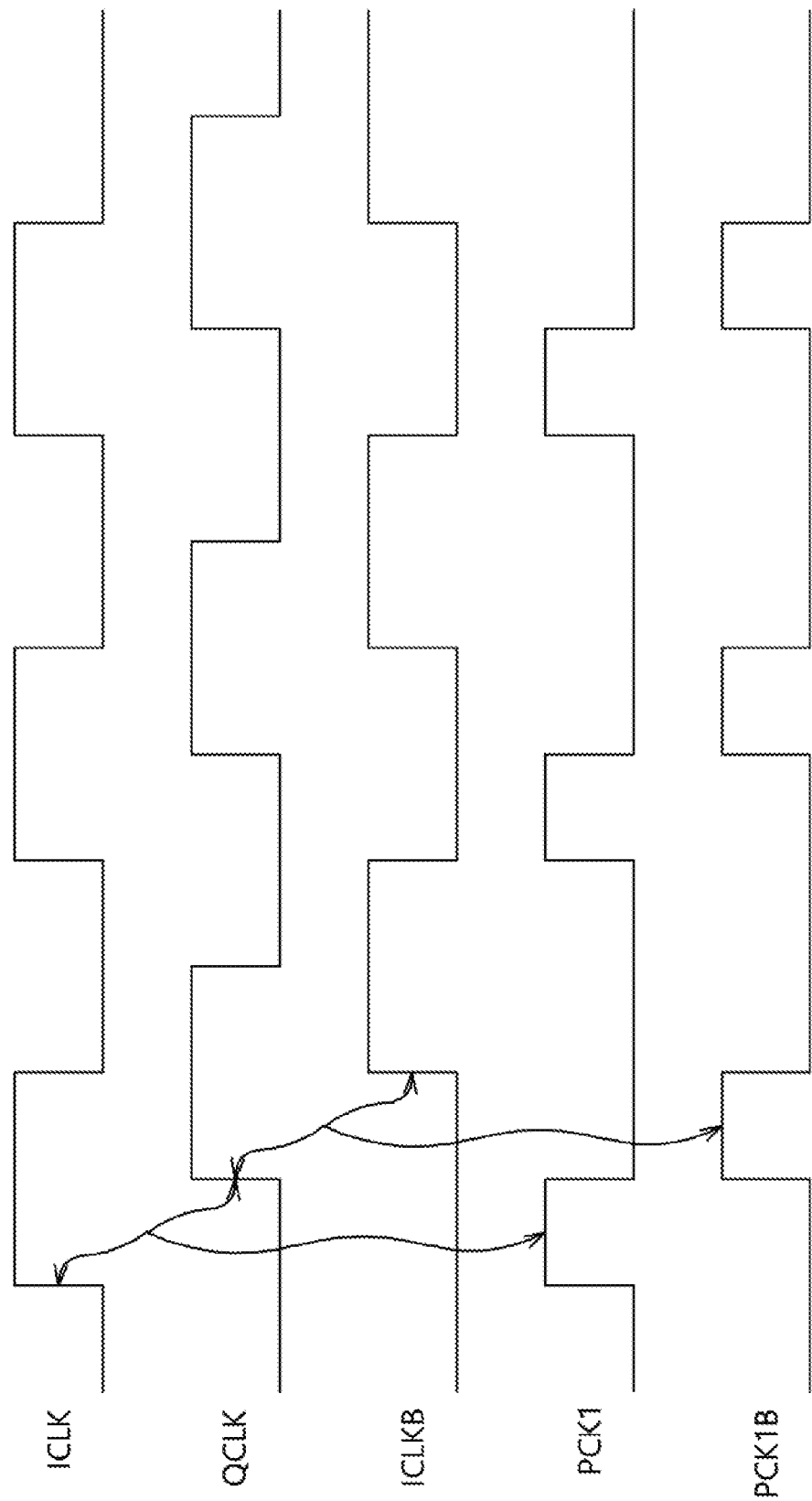

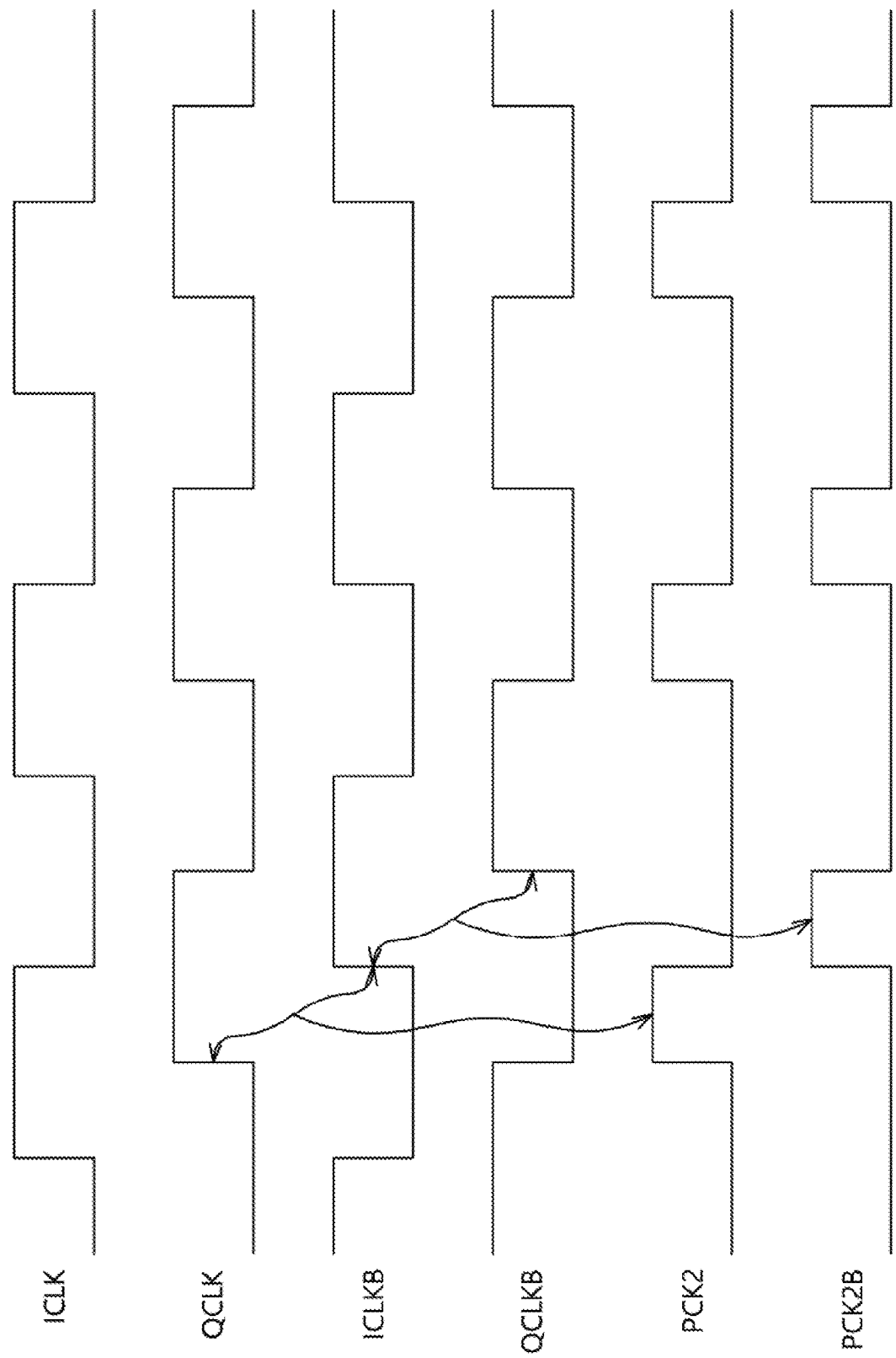

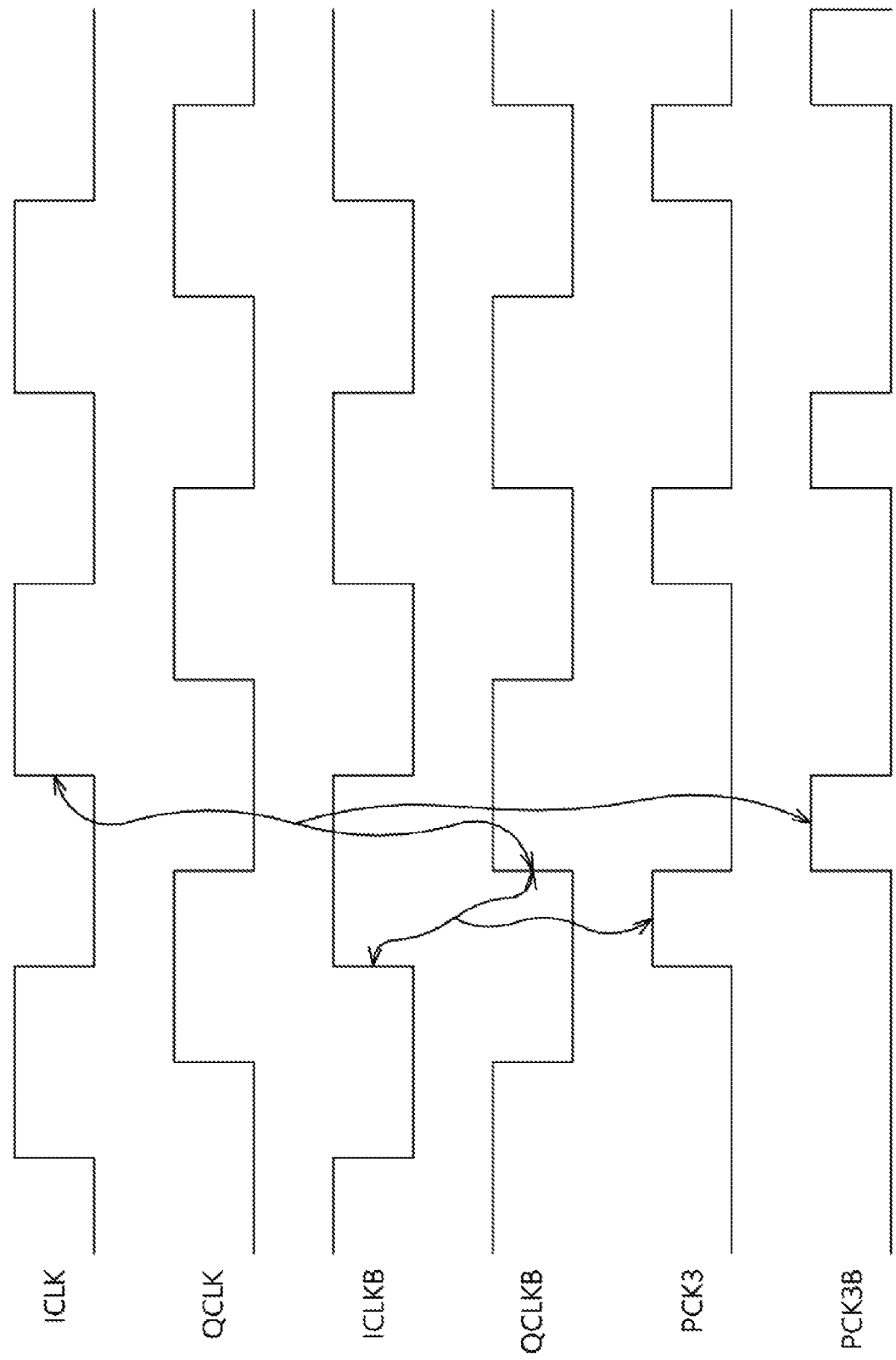

PHASE DETECTION CIRCUIT, AND CLOCK GENERATING CIRCUIT AND SEMICONDUCTOR APPARATUS USING THE PHASE DETECTION CIRCUIT

CROSS-REFERENCES TO RELATED APPLICATION

The present application claims priority under 35 U.S.C. § 119(a) to Korean application number 10-2019-0044170, filed on Apr. 16, 2019, in the Korean Intellectual Property Office, which is incorporated herein by reference in its entirety.

BACKGROUND

1. Technical Field

Various embodiments generally relate to an integrated circuit technology, and more particularly, to a clock generation circuit and a semiconductor device.

2. Related Art

An electronic device includes many electronic elements. Among them, a computer system may include many semiconductor devices configured with a semiconductor. The semiconductor devices configuring the computer system may communicate with each other by transmitting and receiving a system clock signal, such as an external clock signal, and data. The semiconductor devices may operate in synchronization with a clock signal. The semiconductor device may generate an internal clock signal from the system clock signal in order to match operating timing with that of an external device or to secure an operating margin, and may include a clock generation circuit for generating the internal clock signal.

The clock generation circuit may generate the internal clock signal by changing the phase of the system clock signal or dividing the frequency of the system clock signal. Furthermore, the clock generation circuit may generate a plurality of internal clock signals having different phases. The clock generation circuit may include a plurality of clock paths and generate the plurality of internal clock signals. For the operation reliability of the semiconductor device, the plurality of internal clock signals needs to have a given phase difference. However, a phase difference between a plurality of internal clock signals may be different due to the skew of a clock path because the plurality of internal clock signals is generated through different clock paths.

SUMMARY

In an embodiment, a phase detection circuit may include an edge trigger and a duty detection circuit. The edge trigger circuit may be configured to receive a plurality of clock signals having a phase difference with one another and to generate a reference pulse signal and a comparison pulse signal based on a target clock signal and at least two internal clock signals, having phases adjacent to a phase of the target clock signal, among the plurality of clock signals. The duty detection circuit may be configured to generate a phase detection signal by detecting a duty ratio of the reference pulse signal and the comparison pulse signal.

In an embodiment, a clock generation circuit may include a multi-phase clock output circuit and a phase control circuit. The multi-phase clock output circuit may be configured to generate a plurality of internal clock signals having different phases with one another based on a delayed clock signal and a complementary delayed clock signal and to change a phase of at least one of the plurality of internal clock signals based on a delay control signal. The phase control circuit may be configured to generate the delay control signal by detecting a phase of the one internal clock signal based on the one internal clock signal and at least two internal clock signals having phases adjacent to the phase of the one internal clock signal.

BRIEF DESCRIPTION OF THE DRAWINGS

FIGS. 5A, 5B and 5C are diagrams illustrating a plurality of internal clock signals and pulse signals generated by an edge trigger circuit.

DETAILED DESCRIPTION

Figure 1:
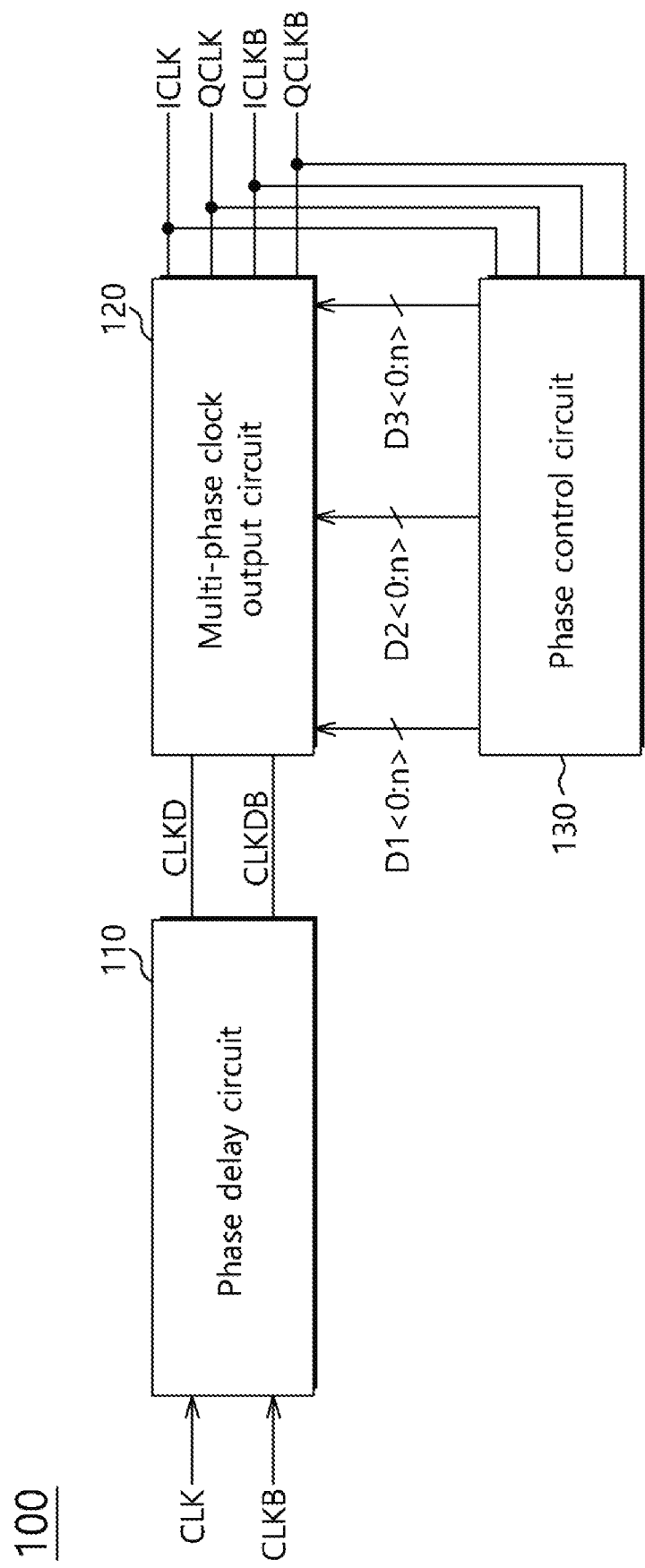
FIG. 1 illustrates a configuration of a clock generation circuit according to an embodiment.

FIG. 1 illustrates a configuration of a clock generation circuit 100 according to an embodiment. In FIG. 1, the clock generation circuit 100 may generate a plurality of internal clock signals, having different phases, from a clock signal CLK. The clock generation circuit 100 may detect the phases of the plurality of internal clock signals. The clock generation circuit 100 may generate a pulse signal based on a plurality of internal clock signals, and may detect the phases of the plurality of internal clock signals by detecting the duty ratio of the pulse signal. The clock generation circuit 100 may adjust the phases of the plurality of internal clock signals based on a result of the detection of the phase.

The clock generation circuit 100 may include a phase delay circuit 110, a multi-phase clock output circuit 120 and a phase control circuit 130. The phase delay circuit 110 may receive the clock signal CLK, and may generate a delayed clock signal CLKD by delaying the clock signal CLK. The phase delay circuit 110 may receive a complementary clock signal CLKB along with the clock signal CLK, and may generate a complementary delayed clock signal CLKDB along with the delayed clock signal CLKD. The phase delay circuit 110 may generate the delayed clock signal CLKD by delaying the clock signal CLK by the delay amount determined based on operation information of a semiconductor device including the clock generation circuit 100. For example, the phase delay circuit 110 may be a delayed locked loop circuit. The phase delay circuit 110 may delay the clock signal CLK so that a modeled delay amount can be compensated for, and may lock the phase of the delayed clock signal CLKD when the delay of the clock signal CLK is completed. The phase delay circuit 110 may perform a coarse delay locked operation and a fine delay locked operation. In the coarse delay locked operation, the clock signal CLK may be delayed in a first delay amount unit. In the fine delay locked operation, the clock signal CLK may be delayed in a second delay amount unit. The first delay amount may be longer than the second delay amount. When the coarse delay locked operation is completed, the phase delay circuit 110 may perform the fine delay locked operation. When the fine delay locked operation is completed, the phase delay circuit 110 may lock the phase of the delayed clock signal CLKD. Any publicly-known delayed locked loop circuit may be applied as a phase delay circuit. In an embodiment, the phase delay circuit 110 may include a phase locked loop circuit. Any publicly-known phase locked loop circuit may be applied as the phase delay circuit 110.

The multi-phase clock output circuit 120 may generate a plurality of internal clock signals, having different phases, based on the delayed clock signal CLKD. For example, the multi-phase clock output circuit 120 may generate a first internal clock signal ICLK, a second internal clock signal QCLK, a third internal clock signal ICLKB and a fourth internal clock signal QCLKB, having sequentially adjacent phases. The first internal clock signal ICLK may have leading phase with respect to the second internal clock signal QCLK. The second internal clock signal QCLK may have leading phase with respect to the third internal clock signal ICLKB. The third internal clock signal ICLKB may have leading phase with respect to the fourth internal clock signal QCLKB. The fourth internal clock signal QCLKB may have leading phase with respect to the first internal clock signal ICLK. The multi-phase clock output circuit 120 may generate the first to fourth internal clock signals ICLK, QCLK, ICLKB and QCLKB sequentially having a phase difference of 90 degrees. The multi-phase clock output circuit 120 may generate the first internal clock signal ICLK and the second internal clock signal QCLK based on the delayed clock signal CLKD, and may generate the third internal clock signal ICLKB and the fourth internal clock signal QCLKB based on the complementary delayed clock signal CLKDB.

The multi-phase clock output circuit 120 may receive a delay control signal. The multi-phase clock output circuit 120 may adjust the phase of at least one internal clock signal based on the delay control signal. The multi-phase clock output circuit 120 may set one of a plurality of internal clock signals as a reference clock signal, and may adjust the phases of the remaining internal clock signals by changing the phases of the remaining internal clock signals except the reference clock signal. Accordingly, the phases of the remaining internal clock signals may be adjusted to have given phase differences, respectively, based on the reference clock signal. For example, the multi-phase clock output circuit 120 may set the first internal clock signal ICLK of the first to fourth internal clock signals ICLK, QCLK, ICLKB and QCLKB as a reference clock signal, and may adjust the phases of the second to fourth internal clock signals QCLK, ICLKB and QCLKB. The delay control signal may include a first delay control signal D1<0:$n$> ($n$ is an integer of 1 or more), a second delay control signal D2<0:$n$> and a third delay control signal D3<0:$n$>. The multi-phase clock output circuit 120 may adjust the phase of the second internal clock signal QCLK based on the first delay control signal D1<0:$n$>. The multi-phase clock output circuit 120 may adjust the phase of the third internal clock signal ICLKB based on the second delay control signal D2<0:$n$>. The multi-phase clock output circuit 120 may adjust the phase of the fourth internal clock signal QCLKB based on the third delay control signal D3<0:$n$>.

The phase control circuit 130 may generate the delay control signal by receiving the plurality of internal clock signals. The phase control circuit 130 may detect the phase of at least one of the plurality of internal clock signals, and may generate the delay control signal based on the detected phase. The one internal clock signal having a phase detected may be a target clock signal. The phase control circuit 130 may detect the phase of the target clock signal based on the target clock signal and at least two internal clock signals having phases adjacent to the target clock signal. The adjacent at least two internal clock signals may include one internal clock signal having leading phase with respect to the target clock signal and one internal clock signal having lagging phase with respect to the target clock signal. The target clock signal may be one of the second to fourth internal clock signals QCLK, ICLKB and QCLKB. The phase control circuit 130 may detect the phase of the second internal clock signal ICLKB based on the first internal clock signal ICLK, the second internal clock signal QCLK and the third internal clock signal ICLKB. The phase control circuit 130 may generate the first delay control signal D1<0:$n$> based on the detected phase of the second internal clock signal QCLK. The phase control circuit 130 may detect the phase of the third internal clock signal ICLKB based on the second internal clock signal QCLK, the third internal clock signal ICLKB and the fourth internal clock signal QCLKB. The phase control circuit 130 may generate the second delay control signal D2<0:$n$> based on the detected phase of the third internal clock signal ICLKB. The phase control circuit 130 may detect the phase of the fourth internal clock signal QCLKB based on the third internal clock signal ICLKB, the fourth internal clock signal QCLKB and the first internal clock signal ICLK. The phase control circuit 130 may generate the third delay control signal D3<0:$n$> based on the detected phase of the fourth internal clock signal QCLKB.

Figure 2:
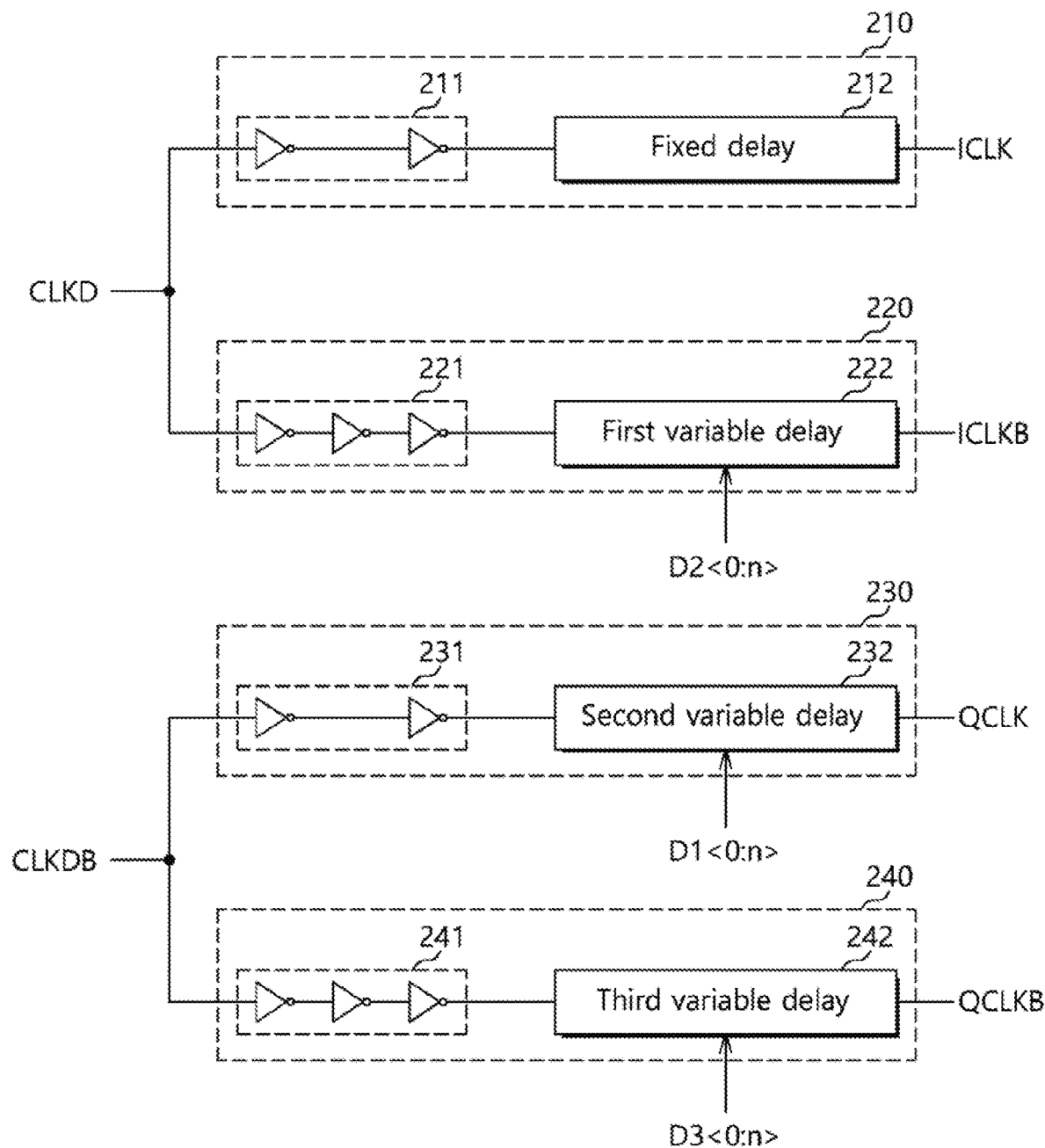
FIG. 2 illustrates a configuration of a multi-phase clock output circuit shown in FIG. 1.

FIG. 2 illustrates a configuration of the multi-phase clock output circuit 120 shown in FIG. 1. The multi-phase clock output circuit 120 may include a first clock output path 210, a second clock output path 220, a third clock output path 230 and a fourth clock output path 240. The first clock output path 210 may receive the delayed clock signal CLKD, and may generate the first internal clock signal ICLK based on the delayed clock signal CLKD. The first clock output path 210 may generate the first internal clock signal ICLK by delaying the delayed clock signal CLKD by a fixed delay time.

The second clock output path 220 may receive the delayed clock signal CLKD, and may generate the third internal clock signal ICLKB based on the delayed clock signal CLKD. The second clock output path 220 may invert the delayed clock signal CLKD, and may generate the third internal clock signal ICLKB by delaying the inverted delayed clock signal by a first variable delay time. The second clock output path 220 may receive the second delay control signal D2<0:$n$>. The first variable delay time may be changed based on the second delay control signal D2<0:$n$>.

The third clock output path 230 may receive the complementary delayed clock signal CLKDB, and may generate the second internal clock signal QCLK based on the complementary delayed clock signal CLKDB. The third clock output path 230 may generate the second internal clock signal QCLK by delaying the complementary delayed clock signal CLKDB by a second variable delay time. The third clock output path 230 may receive the first delay control signal D1<0:$n$>. The second variable delay time may be changed based on the first delay control signal D1<0:$n$>.

The fourth clock output path 240 may receive the complementary delayed clock signal CLKDB, and may generate the fourth internal clock signal QCLKB based on the complementary delayed clock signal CLKDB. The fourth clock output path 240 may invert the complementary delayed clock signal CLKDB, and may generate the fourth internal clock signal QCLKB by delaying the inverted complementary delayed clock signal by a third variable delay time. The fourth clock output path 240 may receive the third delay control signal D3<0:$n$>. The third variable delay time may be changed based on the third delay control signal D3<0:$n$>.

The first clock output path 210 may include a non-inverting buffer 211 and a fixed delay 212. The non-inverting buffer 211 may buffer and output the delayed clock signal CLKD. The fixed delay 212 may output the first internal clock signal ICLK by delaying the output of the non-inverting buffer 211 by the fixed delay time. The second clock output path 220 may include an inverting buffer 221 and a first variable delay 222. The inverting buffer 221 may invert the delayed clock signal CLKD, and may buffer and output the inverted delayed clock signal. The first variable delay 222 may receive the output of the inverting buffer 221 and the first delay control signal D1<0:$n$>. The delay time of the first variable delay 222 may be set based on the first delay control signal D1<0:$n$>. The set delay time may be the first variable delay time. The first variable delay 222 may output the third internal clock signal ICLKB by delaying the output of the inverting buffer 221 by the first variable delay time.

The third clock output path 230 may include a non-inverting buffer 231 and a second variable delay 232. The non-inverting buffer 231 may buffer and output the complementary delayed clock signal CLKDB. The second variable delay 232 may receive the output of the non-inverting buffer 231 and the second delay control signal D2<0:$n$>. The delay time of the second variable delay 232 may be set based on the second delay control signal D2<0:$n$>. The set delay time may be the second variable delay time. The second variable delay 232 may output the second internal clock signal QCLK by delaying the output of the non-inverting buffer 231 by the second variable delay time. The fourth clock output path 240 may include an inverting buffer 241 and a third variable delay 242. The inverting buffer 241 may invert the complementary delayed clock signal CLKDB, and may buffer and output the inverted complementary delayed clock signal. The third variable delay 242 may receive the output of the inverting buffer 241 and the third delay control signal D3<0:$n$>. The delay time of the third variable delay 242 may be set based on the third delay control signal D3<0:$n$>. The set delay time may be the third variable delay time. The third variable delay 242 may output the fourth internal clock signal QCLKB by delaying the output of the inverting buffer 241 by the third variable delay time.

Figure 3:
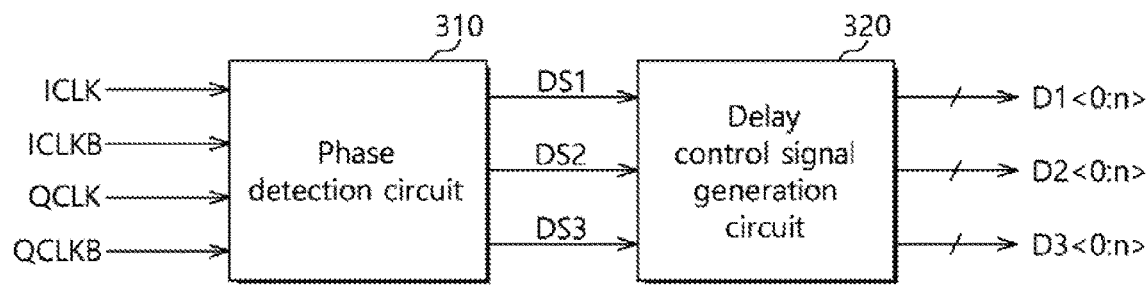
FIG. 3 illustrates a configuration of a phase control circuit shown in FIG. 1.

FIG. 3 illustrates a configuration of the phase control circuit 130 shown in FIG. 1. In FIG. 3, the phase control circuit 130 may include a phase detection circuit 310 and a delay control signal generation circuit 320. The phase detection circuit 310 may generate first to third phase detection signals DS1, DS2 and DS3 by receiving the first to fourth internal clock signals ICLK, QCLK, ICLKB and QCLKB. The phase detection circuit 310 may generate one phase detection signal based on three of the first to fourth internal clock signals ICLK, QCLK, ICLKB and QCLKB. The phase detection circuit 130 may generate the first phase detection signal DS1 based on the first internal clock signal ICLK, the second internal clock signal QCLK and the third internal clock signal ICLKB. The phase detection circuit 130 may generate the second phase detection signal DS2 based on the second internal clock signal QCLK, the third internal clock signal ICLKB and the fourth internal clock signal QCLKB. The phase detection circuit 310 may generate the third phase detection signal DS3 based on the third internal clock signal ICLKB, the fourth internal clock signal QCLKB and the first internal clock signal ICLK.

The delay control signal generation circuit 320 may generate the first to third delay control signals D1<0:$n$>, D2<0:$n$> and D3<0:$n$> by receiving the first to third phase detection signals DS1, DS2 and DS3. The delay control signal generation circuit 320 may generate the first delay control signal D1<0:$n$> based on the second phase detection signal DS2. The delay control signal generation circuit 320 may change a code value of the first delay control signal D1<0:$n$> based on the second phase detection signal DS2. The delay control signal generation circuit 320 may generate the second delay control signal D2<0:$n$> based on the first phase detection signal DS1. The delay control signal generation circuit 320 may change a code value of the second delay control signal D2<0:$n$> based on the first phase detection signal DS1. The delay control signal generation circuit 320 may generate the third delay control signal D3<0:$n$> based on the third phase detection signal DS3. The delay control signal generation circuit 320 may change a code value of the third delay control signal D3<0:$n$> based on the third phase detection signal DS3. For example, if the first to third phase detection signals DS1, DS2 and DS3 are at a logic low level, the delay control signal generation circuit 320 may reduce the code value of each of the first to third delay control signals D1<0:$n$>, D2<0:$n$> and D3<0:$n$>. If the first to third phase detection signals DS1, DS2 and DS3 are at a logic high level, the delay control signal generation circuit 320 may increase the code value of each of the first to third delay control signals D1<0:$n$>, D2<0:$n$> and D3<0:$n$>. If the code values of the first to third delay control signals are reduced, the first to third variable delay times may be reduced. If the code values of the first to third delay control signals D1<0:$n$>, D2<0:$n$> and D3<0:$n$> are increased, the first to third variable delay times may be increased.

Figure 4:
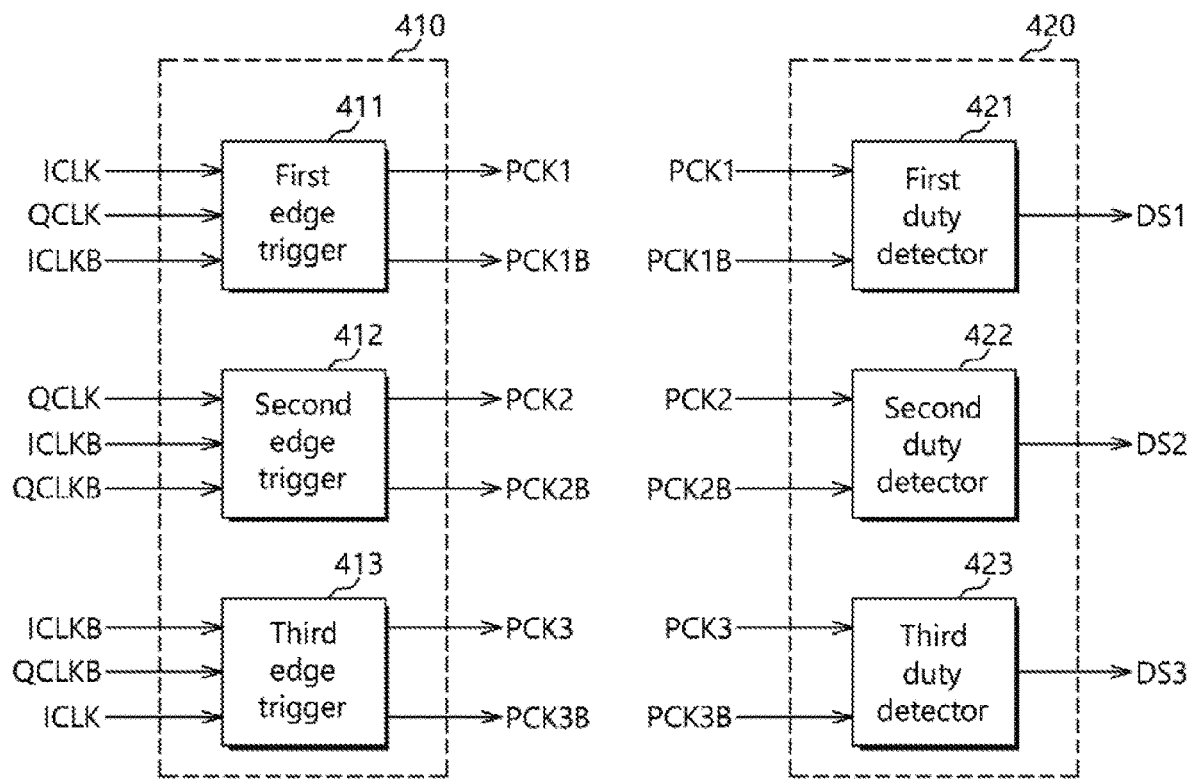
FIG. 4 illustrates a configuration of a phase detection circuit shown in FIG. 3.

FIG. 4 illustrates a configuration of the phase detection circuit 310 shown in FIG. 3. In FIG. 4, the phase detection circuit 310 may include an edge trigger circuit 410 and a duty detection circuit 420. The edge trigger circuit 410 may generate at least two pulse signals based on at least three internal clock signals. The edge trigger circuit 410 may generate a reference pulse signal and a comparison pulse signal based on one internal clock signal and at least two internal clock signals having phases adjacent to that of the one internal clock signal. The edge trigger circuit 410 may generate the reference pulse signal based on the one internal clock signal and an internal clock signal having leading phase with respect to the one internal clock signal. The edge trigger circuit 410 may generate the comparison pulse signal based on the one internal clock signal and an internal clock signal having lagging phase with respect to the one internal clock signal. The reference pulse signal may include a pulse enabled in an interval from the rising edge of the internal clock signal having the leading phase with respect to the one internal clock signal to the rising edge of the one internal clock signal. The comparison pulse signal may include a pulse enabled in an interval from the rising edge of the one internal clock signal to the rising edge of an internal clock signal having lagging phase with respect to the one internal clock signal. The duty detection circuit 420 may receive the reference pulse signal and the comparison pulse signal from the edge trigger circuit 410. The duty detection circuit 420 may generate one phase detection signal based on two pulse signals. The duty detection circuit 420 may generate the phase detection signal based on the reference pulse signal and the comparison pulse signal. The duty detection circuit 420 may generate the phase detection signal by detecting the duty ratio of the reference pulse signal and the comparison pulse signal.

The edge trigger circuit 410 may include a first edge trigger 411, a second edge trigger 412 and a third edge trigger 413. The first edge trigger 411 may receive the first internal clock signal ICLK, the second internal clock signal QCLK and the third internal clock signal ICLKB. The first edge trigger 411 may generate a first reference pulse signal PCK1 and a first comparison pulse signal PCK1B based on the first internal clock signal ICLK, the second internal clock signal QCLK and the third internal clock signal ICLKB. FIG. 5A is a diagram illustrating the phases of internal clock signals and the operation of the first edge trigger. Referring to FIG. 5A, the first to fourth internal clock signals ICLK, QCLK, ICLKB and QCLKB may have sequentially adjacent phases. The first edge trigger 411 may generate the first reference pulse signal PCK1 based on the first phase clock signal ICLK, having leading phase with respect to the second internal clock signal QCLK, and the second internal clock signal QCLK in order to detect the phase of the second internal clock signal QCLK. The first edge trigger 411 may generate the first comparison pulse signal PCK1B based on the second internal clock signal QCLK and the third phase clock signal ICLKB having lagging phase with respect to the second internal clock signal QCLK. The first edge trigger 411 may generate the first reference pulse signal PCK1, including a pulse enabled in an interval from the rising edge of the first internal clock signal ICLK to the rising edge of the second internal clock signal QCLK. The first edge trigger 411 may generate the first comparison pulse signal PCK1B, including a pulse enabled in an interval from the rising edge of the second internal clock signal QCLK to the rising edge of the third internal clock signal ICLKB.

The second edge trigger 412 may receive the second internal clock signal QCLK, the third internal clock signal ICLKB and the fourth internal clock signal QCLKB. The second edge trigger 412 may generate a second reference pulse signal PCK2 and a second comparison pulse signal PCK2B based on the second internal clock signal QCLK, the third internal clock signal ICLKB and the fourth internal clock signal QCLKB. FIG. 5B is a diagram illustrating the phases of internal clock signals and the operation of the second edge trigger. Referring to FIG. 5B, the second edge trigger 412 may generate the second reference pulse signal PCK2 based on the second phase clock signal QCLK, having leading phase with respect to the third internal clock signal ICLKB, and the third internal clock signal ICLKB in order to detect the phase of the third internal clock signal ICLKB. The second edge trigger 412 may generate the second comparison pulse signal PCK2B based on the third internal clock signal ICLKB and the fourth internal clock signal QCLKB having lagging phase with respect to the third internal clock signal ICLKB. The second edge trigger 412 may generate the second reference pulse signal PCK2, including a pulse enabled in an interval from the rising edge of the second internal clock signal QCLK to the rising edge of the third internal clock signal ICLKB. The second edge trigger 412 may generate the second comparison pulse signal PCK2B, including a pulse enabled in an interval from the rising edge of the third internal clock signal ICLKB to the rising edge of the fourth internal clock signal QCLKB.

The third edge trigger 413 may receive the third internal clock signal ICLKB, the fourth internal clock signal QCLKB and the first internal clock signal ICLK. The third edge trigger 413 may generate a third reference pulse signal PCK3 and a third comparison pulse signal PCK3B based on the third internal clock signal ICLKB, the fourth internal clock signal QCLKB and the first internal clock signal ICLK. FIG. 5C is a diagram illustrating the phases of internal clock signals and the operation of the third edge trigger. Referring to FIG. 5C, the third edge trigger 413 may generate the third reference pulse signal PCK3 based on the third phase clock signal ICLKB, having leading phase with respect to the fourth internal clock signal QCLKB, and the fourth internal clock signal QCLKB in order to detect the phase of the fourth internal clock signal QCLKB. The third edge trigger 413 may generate the third comparison pulse signal PCK3B based on the fourth internal clock signal QCLKB and the first phase clock signal ICLK having lagging phase with respect to the fourth internal clock signal QCLKB. The third edge trigger 413 may generate the third reference pulse signal PCK3, including a pulse enabled in an interval from the rising edge of the third internal clock signal ICLKB to the rising edge of the fourth internal clock signal QCLKB. The third edge trigger 413 may generate the third comparison pulse signal PCK3B, including a pulse enabled in an interval from the rising edge of the fourth internal clock signal QCLKB to the rising edge of the first internal clock signal ICLK.

The duty detection circuit 420 may include a first duty detector 421, a second duty detector 422 and a third duty detector 423. The first duty detector 421 may receive the first reference pulse signal PCK1 and the first comparison pulse signal PCK1B, and may generate the first phase detection signal DS1 based on the first reference pulse signal PCK1 and the first comparison pulse signal PCK1B. The first duty detector 421 may generate the first phase detection signal DS1 by detecting the duty ratio of the first reference pulse signal PCK1 and the first comparison pulse signal PCK1B. For example, the first duty detector 421 may generate the first phase detection signal DS1 by relatively comparing the high level interval of the first reference pulse signal PCK1 with the high level interval of the first comparison pulse signal PCK1B. The second duty detector 422 may receive the second reference pulse signal PCK2 and the second comparison pulse signal PCK2B, and may generate the second phase detection signal DS2 based on the second reference pulse signal PCK2 and the second comparison pulse signal PCK2B. The second duty detector 422 may generate the second phase detection signal DS2 by detecting the duty ratio of the second reference pulse signal PCK2 and the second comparison pulse signal PCK2B. For example, the second duty detector 422 may generate the second phase detection signal DS2 by relatively comparing the high level interval of the second reference pulse signal PCK2 with the high level interval of the second comparison pulse signal PCK2B. The third duty detector 423 may receive the third reference pulse signal PCK3 and the third comparison pulse signal PCK3B, and may generate the third phase detection signal DS3 based on the third reference pulse signal PCK3 and the third comparison pulse signal PCK3B. The third duty detector 423 may generate the third phase detection signal DS3 by detecting the duty ratio of the third reference pulse signal PCK3 and the third comparison pulse signal PCK3B. For example, the third duty detector 423 may generate the third phase detection signal DS3 by relatively comparing the high level interval of the third reference pulse signal PCK3 with the high level interval of the third comparison pulse signal PCK3B.

Figure 6:
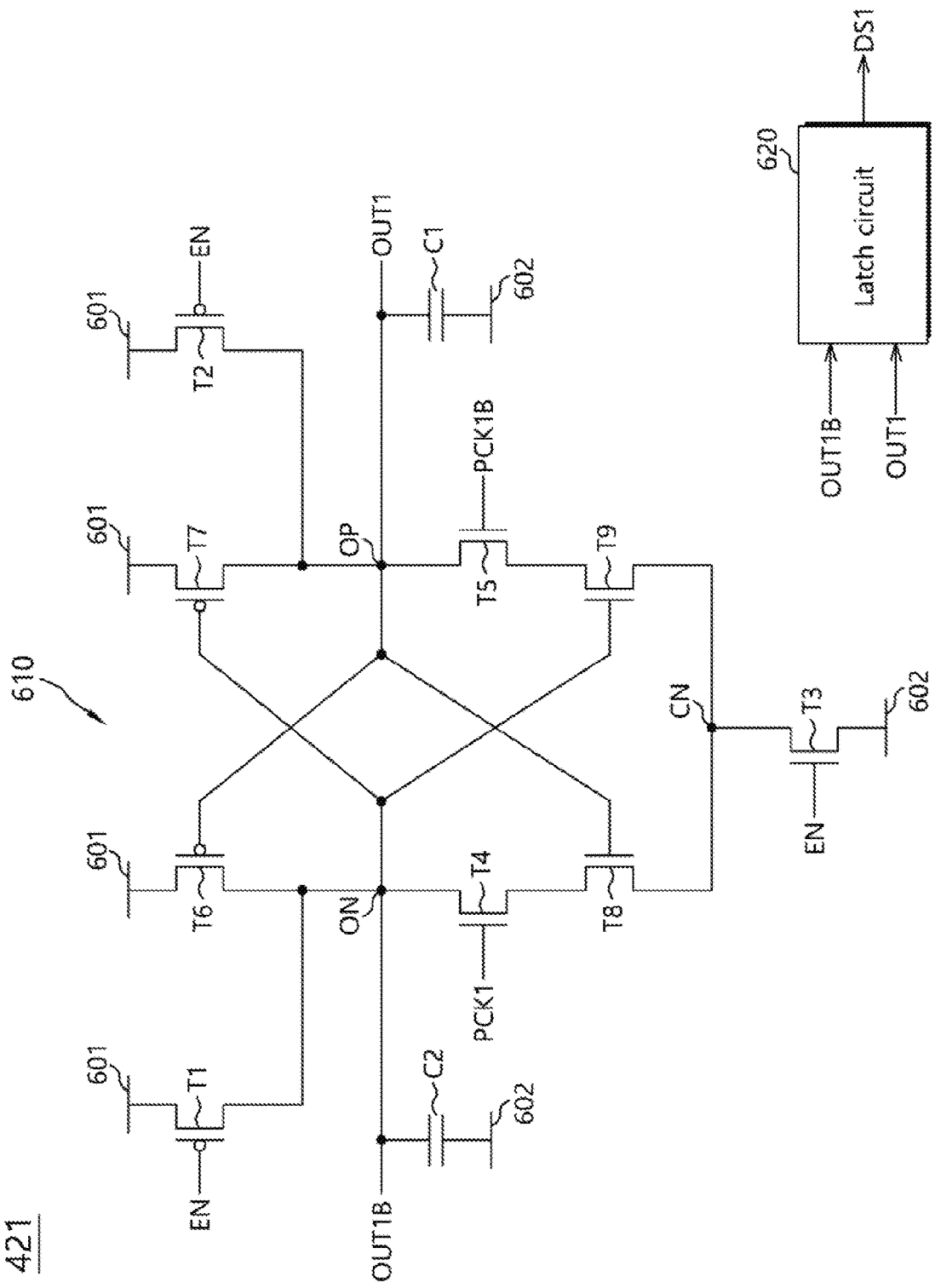
FIG. 6 illustrates a configuration of a first duty detector shown in FIG. 4.

FIG. 6 illustrates a configuration of the first duty detector 421 shown in FIG. 4. In FIG. 6, the first duty detector 421 may include a comparator 610 and a latch circuit 620. The comparator 610 may include a first capacitor C1 and a second capacitor C2. The first capacitor C1 may be coupled to a positive output node OP, and the second capacitor C2 may be coupled to a negative output node ON. A first output signal OUT1 may be output through the positive output node OP. A first complementary output signal OUT1B may be generated through the negative output node ON. The first capacitor C1 may have the same capacitance as the second capacitor C2. In some embodiments, the first capacitor C1 may have substantially the same capacitance as the second capacitor C2. In other embodiments the first and second capacitors C1 and C2 have identical capacitance. The comparator 610 may generate the first output signal OUT1 and the first complementary output signal OUT1B by discharging the negative output node ON based on the first reference pulse signal PCK1 and discharging the positive output node OP based on the first comparison pulse signal PCK1B. The latch circuit 620 may receive the first output signal OUT1 and the first complementary output signal OUT1B. The latch circuit 620 may generate the first phase detection signal DS1 by latching the first output signal OUT1 and the first complementary output signal OUT1B. For example, the latch circuit 620 may generate the first phase detection signal DS1 having a logic high level based on the first complementary output signal OUT1B, and may generate the first phase detection signal DS1 having a logic low level based on the first output signal OUT1.

In FIG. 6, the comparator 610 may include a first transistor T1, a second transistor T2, a third transistor T3, a fourth transistor T4, a fifth transistor T5, a sixth transistor T6, a seventh transistor T7, an eighth transistor T8, a ninth transistor T9, the first capacitor C1 and the second capacitor C2. The first and second transistors T1 and T2 may be P channel MOS transistors. The first transistor T1 may be coupled between a first power supply terminal 601 and the negative output node ON, and may receive an enable signal EN through a gate. The first power supply terminal 601 may receive a first power source voltage. The enable signal EN may be a signal that enables the first duty detector 421 so that the first duty detector 421 can perform a duty sensing operation. The enable signal EN may be periodically enabled. The first duty detector 421 may perform a duty sensing operation whenever the enable signal EN is enabled. The second transistor T2 may be coupled between the first power supply terminal 601 and the positive output node OP, and may receive the enable signal EN through a gate. The third transistor T3 may be an N channel MOS transistor. The third transistor T3 may be coupled between a common node CN and a second power supply terminal 602, and may receive the enable signal EN through a gate. The second power supply terminal 602 may receive a second power source voltage. The second power source voltage may have a lower voltage level than the first power source voltage.

The fourth and fifth transistors T4 and T5 may be N channel MOS transistors. The fourth transistor T4 may receive the first reference pulse signal PCK1 through a gate, and may have a drain coupled to the negative output node ON. The fifth transistor T5 may receive the first comparison pulse signal PCK1B through a gate, and may have a drain coupled to the positive output node OP. The sixth and seventh transistors T6 and T7 may be P channel transistors. The eighth and ninth transistors T8 and T9 may be N channel transistors. The sixth to ninth transistors T6, T7, T8 and T9 may form a cross-coupled latch structure. The sixth transistor T6 may have a gate coupled to the positive output node OP, may have a source coupled to the first power supply terminal 601, and may have a drain coupled to the negative output node ON. The seventh transistor T7 may have a gate coupled to the negative output node ON, may have a source coupled to the first power supply terminal 601, and may have a drain coupled to the positive output node OP. The eighth transistor T8 may have a gate coupled to the positive output node OP, may have a drain coupled to a source of the fourth transistor T4, and may have a source coupled to the common node CN. The ninth transistor T9 may having a gate coupled to the negative output node ON, may have a drain coupled to a source of the fifth transistor T5, and may have a source coupled to the common node CN.

The first capacitor C1 may have one end coupled to the positive output node OP, and may have the other end coupled to the second power supply terminal 602. The second capacitor C2 may have one end coupled to the negative output node ON, and may have the other end coupled to the second power supply terminal 602.

If the enable signal EN is disabled, the first and second transistors T1 and T2 may be turned on and the first and second capacitors C1 and C2 may be charged with the first power source voltage. If the enable signal EN is enabled, the third transistor T3 may enable the comparator 610 by coupling the common node CN and the second power supply terminal 602. The fourth transistor T4 may change a voltage level of the negative output node ON based on the first reference pulse signal PCK1. The fourth transistor T4 may change a voltage level of the negative output node ON by discharging the second capacitor C2 in the high level interval of the first reference pulse signal PCK1. The fifth transistor T5 may change a voltage level of the positive output node OP based on the first comparison pulse signal PCK1B. The fifth transistor T5 may change a voltage level of the positive output node ON by discharging the second capacitor C2 in the high level interval of the first comparison pulse signal PCK1B. The sixth to ninth transistors T6, T7, T8 and T9 may amplify and latch a voltage level of the positive output node OP and a voltage level of the negative output node ON. When the high level interval of the first reference pulse signal PCK1 is longer than the high level interval of the first comparison pulse signal PCK1B, the comparator 610 may output the first output signal OUT1 at a logic high level and output the first complementary output signal OUT1B at a logic low level. Accordingly, the latch circuit 620 may generate the first phase detection signal DS1 having a logic low level. In contrast, when the high level interval of the first reference pulse signal PCK1 is longer than the high level interval of the first comparison pulse signal PCK1B, the comparator 610 may output the first output signal OUT1 at a logic low level and output the first complementary output signal OUT1B at a logic high level. Accordingly, the latch circuit 620 may generate the first phase detection signal DS1 having a logic high level.

Although not shown, the second duty detector 422 and the third duty detector 423 may have substantially the same configuration as the first duty detector 421 shown in FIG. 6. The comparator of the second duty detector 422 may receive the second reference pulse signal PCK2 and the second comparison pulse signal PCK2B instead of the first reference pulse signal PCK1 and the first comparison pulse signal PCK1B, and may generate a second output signal and a second complementary output signal instead of the first output signal OUT1 and the first complementary output signal OUT1B. The latch circuit of the second duty detector 422 may receive the second output signal and the second complementary output signal instead of the first output signal OUT1 and the first complementary output signal OUT1B, and may generate the second phase detection signal DS2 instead of the first phase detection signal DS1. The comparator of the third duty detector 423 may receive the third reference pulse signal PCK3 and the third comparison pulse signal PCK3B instead of the first reference pulse signal PCK1 and the first comparison pulse signal PCK1B, and may generate a third output signal and a third complementary output signal instead of the first output signal OUT1 and the first complementary output signal OUT1B. The latch circuit of the third duty detector 423 may receive the third output signal and the third complementary output signal instead of the first output signal OUT1 and the first complementary output signal OUT1B, and may generate the third phase detection signal DS3 instead of the first phase detection signal DS1.

An operation of the clock generation circuit 100 according to an embodiment will be described below with reference to FIGS. 1 to 6. When the coarse delay locked operation and fine delay locked operation of the phase delay circuit 110 are completed, the phases of the delayed clock signal CLKD and the complementary delayed clock signal CLKDB may be locked. The multi-phase clock output circuit 120 may generate the first internal clock signal ICLK and the third internal clock signal ICLKB from the delayed clock signal CLKD, and may generate the second internal clock signal QCLK and the fourth internal clock signal QCLKB from the complementary delayed clock signal CLKDB. Ideally, the second internal clock signal QCLK may be generated to have lagging phase with respect to the first internal clock signal ICLK by 90 degrees. However, the first to fourth internal clock signals ICLK, QCLK, ICLKB and QCLKB may have a phase difference smaller than or greater than 90 degrees because each of the clock output paths 210, 220, 230, and 240 has a skew and/or an offset.

The first edge trigger 411 may generate the first reference pulse signal PCK1 enabled in the interval from the rising edge of the first internal clock signal ICLK to the rising edge of the second internal clock signal QCLK, and may generate the first comparison pulse signal PCK1B enabled in the interval from the rising edge of the second internal clock signal QCLK to the rising edge of the third internal clock signal ICLKB. The first duty detector 421 may generate the first phase detection signal DS1 by changing logic levels of the first output signal OUT1 and the first complementary output signal OUT1B based on the first reference pulse signal PCK1 and the first comparison pulse signal PCK1B. The first duty detector 421 may generate the first phase detection signal DS1 having a logic high level or a logic low level until a relative duty ratio of the first reference pulse signal PCK1 and the first comparison pulse signal PCK1B is 1:1. The delay control signal generation circuit 320 may change the second variable delay time by changing a code value of the first delay control signal D1<0:$n$> in response to the first phase detection signal DS1. The second variable delayer 232 may adjust the phase of the second internal clock signal QCLK based on the first delay control signal D1<0:$n$>.

Likewise, the second duty detector 422 may generate the second phase detection signal DS2 having a logic high level or a logic low level until a relative duty ratio of the second reference pulse signal PCK2 and the second comparison pulse signal PCK2B is 1:1. The delay control signal generation circuit 320 may change the first variable delay time by changing a code value of the second delay control signal D2<0:$n$> in response to the second phase detection signal DS2. The first variable delayer 222 may adjust the phase of the third internal clock signal ICLKB based on the second delay control signal D2<0:$n$>. The third duty detector 423 may generate the third phase detection signal DS3 having a logic high level or a logic low level until a relative duty ratio of the third reference pulse signal PCK3 and the third comparison pulse signal PCK3B is 1:1. The delay control signal generation circuit 320 may change the third variable delay time by changing a code value of the third delay control signal D3<0:$n$> in response to the third phase detection signal DS3. The third variable delayer 242 may adjust the phase of the fourth internal clock signal QCLKB based on the third delay control signal D3<0:$n$>. Accordingly, the phases of the first to fourth internal clock signals ICLK, QCLK, ICLKB and QCLKB may be adjusted so that a phase difference therebetween becomes constant.

The phase detection circuit 310 according to an embodiment may generate two pulse signals from three internal clock signals having adjacent phases, and may generate a phase detection signal by detecting the duty ratio of the two pulse signals. One of the two pulse signals may be generated based on the rising edge of one internal clock signal and the rising edge of an internal clock signal having leading phase with respect to the one internal clock signal. The other of the two pulse signals may be generated based on the rising edge of the one internal clock signal and the rising edge of an internal clock signal having lagging phase with respect to the one internal clock signal. That is, the two pulse signals may be generated based on the rising edge of an internal clock signal having an adjacent phase. Accordingly, capacitors coupled to the positive output node and negative output node of a duty detector may have the same capacitance. The duty detectors may be designed symmetrically. Accordingly, the duty detector can perform an accurate duty sensing operation so that the phases of a plurality of internal clock signals can be adjusted precisely.

Figure 7:
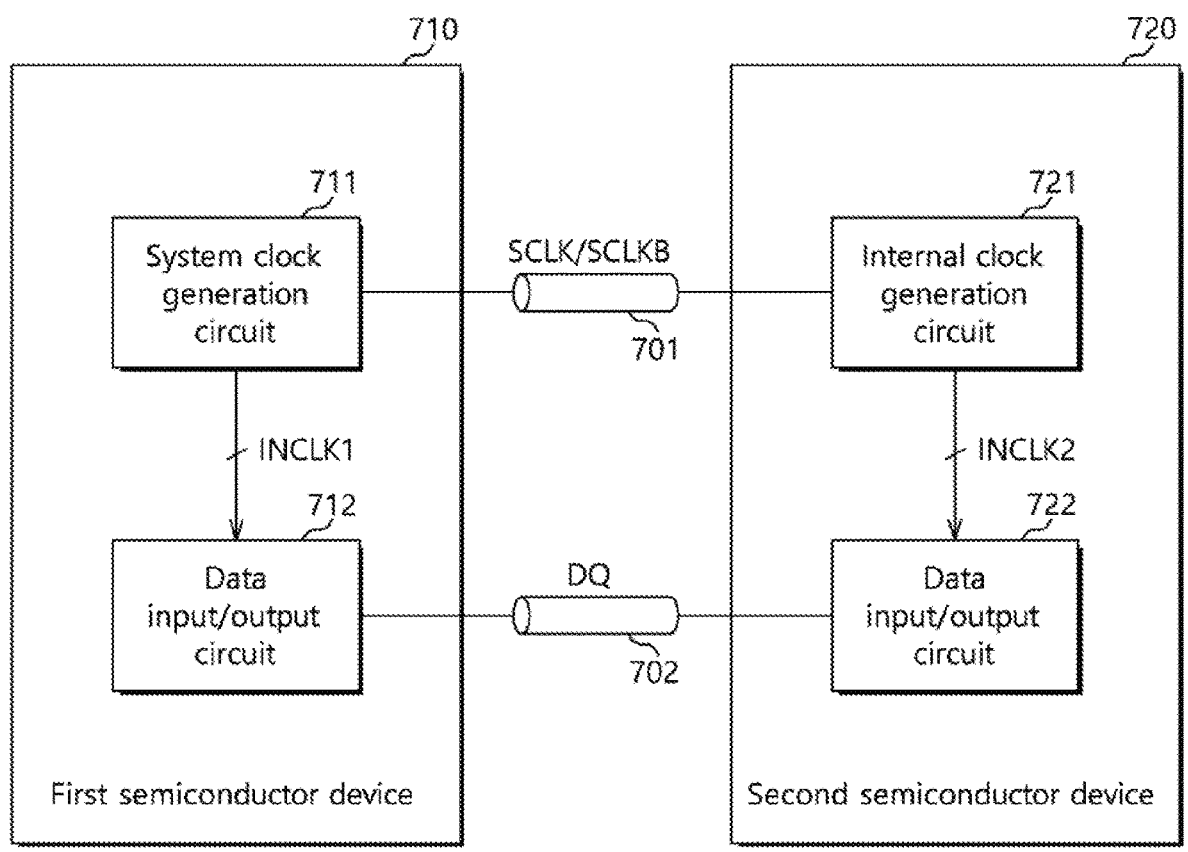
FIG. 7 illustrates a configuration of a semiconductor system according to an embodiment.

FIG. 7 illustrates a configuration of a semiconductor system 700 according to an embodiment. In FIG. 7, the semiconductor system 700 may include a first semiconductor device 710 and a second semiconductor device 720. The first semiconductor device 710 may provide various control signals necessary for the second semiconductor device 720 to operate. The first semiconductor device 710 may include various types of devices. For example, the first semiconductor device 710 may be a host device, such as a central processing unit (CPU), a graphic processing unit (GPU), a multimedia processor (MMP), a digital signal processor, an application processor (AP) or a memory controller. The second semiconductor device 720 may be a memory device, for example. The memory device may include a volatile memory and a non-volatile memory. The volatile memory may include a static RAM (SRAM), a dynamic RAM (DRAM), and a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM) and a ferroelectric RAM (FRAM).

The second semiconductor device 720 may be coupled to the first semiconductor device 710 through a plurality of buses. The plurality of buses may be a signal transmission path, link or channel for transmitting a signal. The plurality of buses may include a clock bus 701 and a data bus 702. The clock bus 701 may be a one-way bus, and the data bus 702 may be a two-way bus. Although not shown, the semiconductor system 700 may further include a command bus and address bus for transmitting a command signal and an address signal from the first semiconductor device 710 to the second semiconductor device 720. The second semiconductor device 720 may be coupled to an first semiconductor device 710 through the clock bus 701, and may receive a system clock signal SCLK through the clock bus 701. The system clock signal SCLK may be transmitted as a single-ended signal, and may be transmitted as a differential signal along with a complementary system clock signal SCLKB. The second semiconductor device 720 may be coupled to the first semiconductor device 710 through the data bus 702, and may receive data DQ from the first semiconductor device 710 or transmit data DQ to the first semiconductor device 710 through the data bus 702.

The first semiconductor device 710 may include a system clock generation circuit 711 and a data input/output circuit 712. The system clock generation circuit 711 may generate the system clock signal SCLK. The system clock generation circuit 711 may provide the system clock signal SCLK to the second semiconductor device 720 through the clock bus 701. The system clock generation circuit 711 may generate the system clock signal SCLK along with the complementary signal SCLKB, and may transmit the signal. The system clock generation circuit 711 may include a clock generation circuit, such as a phase locked loop circuit. The system clock generation circuit 711 may generate a plurality of first internal clock signals INCLK1, sequentially having given phase differences, from the system clock signal SCLK. The clock generation circuit 100 shown in FIG. 1 may be applied as the system clock generation circuit 711. The data input/output circuit 712 may receive the plurality of first internal clock signals INCLK1 from the system clock generation circuit 711. The data input/output circuit 712 may be coupled to the data bus 702, and may transmit data DQ through the data bus 702 or receive data DQ transmitted through the data bus 702. The data input/output circuit 712 may transmit the data DQ to the second semiconductor device 720 in synchronization with the plurality of first internal clock signals INCLK1, or may receive data DQ, transmitted by the second semiconductor device 720, in synchronization with the plurality of first internal clock signals INCLK1.

The second semiconductor device 720 may include an internal clock generation circuit 721 and a data input/output circuit 722. The internal clock generation circuit 721 may be coupled to the clock bus 701, and may receive the system clock signal SCLK and the complementary signal SCLKB transmitted through the clock bus 701. The internal clock generation circuit 721 may include a delayed locked loop circuit configured to generate the delayed clock signal CLKD by delaying the system clock signal SCLK. The internal clock generation circuit 721 may generate a plurality of second internal clock signals INCLK2, sequentially having given phase differences, from the delayed clock signal CLKD. The clock generation circuit 100 shown in FIG. 1 may be applied as the internal clock generation circuit 721. The data input/output circuit 722 may receive the plurality of second internal clock signals INCLK2 from the internal clock generation circuit 721. The data input/output circuit 722 may be coupled to the data bus 702, and may transmit data DQ through the data bus 702 or receive data DQ transmitted through the data bus 702. The data input/output circuit 722 may transmit the data DQ to the first semiconductor device 710 in synchronization with the plurality of second internal clock signals INCLK2, or may receive data DQ transmitted by the first semiconductor device 710 in synchronization with the plurality of second internal clock signals INCLK2.

Those skilled in the art to which the disclosure pertains should understand that the embodiments are only illustrative from all aspects not being limitative because the disclosure may be implemented in various other forms without departing from the technical spirit or essential characteristics of the disclosure. Accordingly, the scope of the disclosure is defined by the appended claims rather than by the detailed description, and all modifications or variations derived from the meanings and scope of the claims and equivalents thereof should be understood as being included in the scope of the disclosure.

What is claimed is:

1. A phase detection circuit comprising:
   an edge trigger circuit configured to receive a plurality of clock signals having a phase difference with one another and to generate a reference pulse signal and a comparison pulse signal based on a target clock signal and at least two clock signals, having phases adjacent to a phase of the target clock signal, among the plurality of clock signals; and
   a duty detection circuit configured to generate a phase detection signal by detecting a duty ratio of the reference pulse signal and the comparison pulse signal.

2. The phase detection circuit according to claim 1, wherein the edge trigger circuit generates the reference pulse signal having a pulse enabled in an interval from a rising edge of a clock signal which has leading phase with respect to the target clock signal, to a rising edge of the target clock signal, and generates the comparison pulse signal having a pulse enabled in an interval from the rising edge of the target clock signal to a rising edge of a clock signal which has lagging phase with respect to the target clock signal.

3. The phase detection circuit according to claim 1, wherein the duty detection circuit comprises:
   a comparator configured to generate an output signal and a complementary output signal by detecting the duty ratio of the reference pulse signal and the comparison pulse signal; and
   a latch circuit configured to generate the phase detection signal based on the output signal and the complementary output signal.

4. The phase detection circuit according to claim 3, wherein the comparator comprises a first capacitor coupled to a positive output node and a second capacitor coupled to a negative output node,
   the comparator outputs the complementary output signal through the negative output node by discharging the negative output node based on the reference pulse signal and outputs the output signal through the positive output node by discharging the positive output node based on the comparison pulse signal, and
   the first and second capacitors have substantially the same capacitance.

5. The phase detection circuit according to claim 1, wherein the plurality of clock signals comprises a first clock signal, a second clock signal, a third clock signal and a fourth clock signal, and
   the edge trigger circuit comprises:
   a first edge trigger configured to generate a first reference pulse signal and a first comparison pulse signal based on the first clock signal, the second clock signal and the third clock signal;
   a second edge trigger configured to generate a second reference pulse signal and a second comparison pulse signal based on the second clock signal, the third clock signal and the fourth clock signal; and a third edge trigger configured to generate a third reference pulse signal and a third comparison pulse signal based on the third clock signal, the fourth clock signal and the first clock signal.

6. The phase detection circuit according to claim 4, wherein the duty detection circuit comprises:
a first duty detector configured to generate a first phase detection signal based on the first reference pulse signal and the first comparison pulse signal;
a second duty detector configured to generate a second phase detection signal based on the second reference pulse signal and the second comparison pulse signal; and
a third duty detector configured to generate a third phase detection signal based on the third reference pulse signal and the third comparison pulse signal.

7. A clock generation circuit comprising:
a multi-phase clock output circuit configured to generate a plurality of internal clock signals having different phases with one another responsive to a delayed clock signal and a complementary delayed clock signal and to change a phase of at least one of the plurality of internal clock signals responsive to a delay control signal; and
a phase control circuit coupled to the multi-phase clock output circuit and which is configured to generate the delay control signal by detecting a phase of the one internal clock signal responsive to, the one internal clock signal and at least two internal clock signals, which are received directly from the multi-phase clock output circuit, the at least two internal clock signals, having phases adjacent the phase of the one internal clock signal.

8. The clock generation circuit according to claim 7, further comprising:
a phase delay circuit configured to generate the delayed clock signal by delaying a phase of a clock signal and to generate the complementary delayed clock signal by delaying a phase of a complementary clock signal.

9. The clock generation circuit according to claim 7, wherein the multi-phase clock output circuit sets a reference clock signal from the plurality of internal clock signals to change the phase of the one internal clock signal which is chosen from the remaining internal clock signals which exclude the reference clock signal, and
wherein the multi-phase clock output circuit generates the remaining clock signals having the different phases based on the reference clock signal.

10. The clock generation circuit according to claim 7, wherein the plurality of internal clock signals comprises a first internal clock signal, second internal clock signal, third internal clock signal and fourth internal clock signal having sequentially adjacent phases, and
the multi-phase clock output circuit comprises:
a first clock output path configured to generate the first internal clock signal by delaying the delayed clock signal by a fixed delay time;
a second clock output path configured to invert the delayed clock signal and generate the third internal clock signal by delaying the inverted delayed clock signal by a first variable delay time based on a second delay control signal;
a third clock output path configured to generate the second internal clock signal by delaying the complementary delayed clock signal by a second variable delay time based on a first delay control signal; and
a fourth clock output path configured to invert the complementary delayed clock signal and generate the fourth internal clock signal by delaying the inverted complementary delayed clock signal by a third variable delay time based on a third delay control signal.

11. The clock generation circuit according to claim 7, wherein the phase control circuit comprises:
a phase detection circuit configured to generate a phase detection signal by detecting the phase of the one internal clock signal based on the one internal clock signal and the at least two internal clock signals having phases adjacent to the phase of the one internal clock signal; and
a delay control signal generation circuit configured to generate the delay control signal based on the phase detection signal.

12. The clock generation circuit according to claim 11, wherein the phase detection circuit comprises:
an edge trigger circuit configured to generate a reference pulse signal based on the one internal clock signal and an internal clock signal which has leading phase with respect to the one internal clock signal among the at least two internal clock signals and to generate a comparison pulse signal based on the one internal clock signal and an internal clock signal which has lagging phase with respect to the one internal clock signal among the at least two internal clock signals; and
a duty detection circuit configured to generate the phase detection signal based on the reference pulse signal and the comparison pulse signal.

13. The clock generation circuit according to claim 7, wherein the two internal clock signals having the phases adjacent the phase of the one internal clock signal includes an internal clock signal having a leading phase with respect to the one internal clock signal and an internal clock signal having a lagging phase with respect to the one internal clock signal.

14. The clock generation circuit according to claim 12, wherein the reference pulse signal comprises a pulse enabled in an interval from a rising edge of the internal clock signal having the leading phase to a rising edge of the one internal clock signal, and
the comparison pulse signal comprises a pulse enabled in an interval from the rising edge of the one internal clock signal to a rising edge of the internal clock signal having the lagging phase.

15. The clock generation circuit according to claim 12, wherein the duty detection circuit comprises:
a comparator configured to generate an output signal and a complementary output signal by detecting the duty ratio of the reference pulse signal and the comparison pulse signal; and
a latch circuit configured to generate the phase detection signal based on the output signal and the complementary output signal.

16. The clock generation circuit according to claim 15, wherein the comparator comprises a first capacitor coupled to a positive output node and a second capacitor coupled to a negative output node,
the comparator outputs the complementary output signal through the negative output node by discharging the negative output node based on the reference pulse signal and outputs the output signal through the positive output node by discharging the positive output node based on the comparison pulse signal, and
the first and second capacitors have substantially the same capacitance.

17. The clock generation circuit according to claim 11, wherein the plurality of internal clock signals comprises a first internal clock signal, second internal clock signal, third internal clock signal and fourth internal clock signal having sequentially adjacent phases, and
the phase detection circuit comprises:
an edge trigger circuit configured to generate two pulse signals based on three internal clock signals among the first to fourth internal clock signals; and
a duty detection circuit configured to generate the phase detection signal based on the two pulse signals.

18. The clock generation circuit according to claim 17, wherein the edge trigger circuit comprises:
a first edge trigger configured to generate a first reference pulse signal and a first comparison pulse signal based on the first internal clock signal, the second internal clock signal and the third internal clock signal;
a second edge trigger configured to generate a second reference pulse signal and a second comparison pulse signal based on the second internal clock signal, the third internal clock signal and the fourth internal clock signal; and
a third edge trigger configured to generate a third reference pulse signal and a third comparison pulse signal based on the third internal clock signal, the fourth internal clock signal and the first internal clock signal.

19. The clock generation circuit according to claim 17, wherein the duty detection circuit comprises:
a first comparator configured to generate a first output signal and a first complementary output signal based on the first reference pulse signal and the first comparison pulse signal;
a second comparator configured to generate a second output signal and a second complementary output signal based on the second reference pulse signal and the second comparison pulse signal; and
a third comparator configured to generate a third output signal and a third complementary output signal based on the third reference pulse signal and the third comparison pulse signal.

20. The clock generation circuit according to claim 19, wherein the duty detection circuit comprises:
a first latch circuit configured to generate a first phase detection signal based on the first output signal and the first complementary output signal;
a second latch circuit configured to generate a second phase detection signal based on the second output signal and the second complementary output signal; and
a third latch circuit configured to generate a third phase detection signal based on the third output signal and the third complementary output signal.

21. The clock generation circuit according to claim 20, wherein the delay control signal generation circuit generates a first delay control signal based on the first phase detection signal, generates a second delay control signal based on the second phase detection signal, and generates a third delay control signal based on the third phase detection signal.

22. A clock generation circuit comprising:
a multi-phase clock output circuit configured to generate a plurality of internal clock signals having different phases with one another based on a delayed clock signal and a complementary delayed clock signal and to change a phase of at least one of the plurality of internal clock signals based on a delay control signal; and
a phase control circuit configured to detect a phase of one internal clock signal by generating a first pulse signal based on the one internal clock signal and an internal clock signal which has leading phase with respect to the one internal clock signal, generating a second pulse signal base on the one internal clock signal and an internal clock signal which has lagging phase with respect to the one internal clock signal, and generating a phase detection signal base on the first and second pulse signals, and configured to generate the delay control signal based on the phase detection signal.

* * * * *